US 11,876,487 B2

(12) United States Patent
Jung et al.

(10) Patent No.: US 11,876,487 B2
(45) Date of Patent: Jan. 16, 2024

(54) OSCILLATOR USING SAMPLING PLL-BASED INJECTION

(71) Applicant: Samsung Electronics Co., Ltd., Suwon-si (KR)

(72) Inventors: Jaehong Jung, Suwon-si (KR); Seungjin Kim, Suwon-si (KR); Seunghyun Oh, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 18/152,418

(22) Filed: Jan. 10, 2023

(65) Prior Publication Data

US 2023/0291354 A1    Sep. 14, 2023

(30) Foreign Application Priority Data

Mar. 8, 2022   (KR) .................. 10-2022-0029478
Jun. 17, 2022  (KR) .................. 10-2022-0074250

(51) Int. Cl.
*H03B 5/36* (2006.01)
*H03L 7/099* (2006.01)

(52) U.S. Cl.
CPC ............ *H03B 5/36* (2013.01); *H03L 7/099* (2013.01); *H03B 2200/009* (2013.01)

(58) Field of Classification Search
CPC ...... H03B 5/36; H03B 2200/009; H03L 7/099
USPC ..................... 331/57, 158, 116 FE
See application file for complete search history.

(56) References Cited

U.S. PATENT DOCUMENTS

| 8,050,375 | B2 | 11/2011 | Staszewski et al. |
| 9,331,878 | B2 | 5/2016 | Cheng et al. |
| 9,515,604 | B2 | 12/2016 | Griffith et al. |
| 10,594,325 | B2 | 3/2020 | Aboudina et al. |
| 10,673,383 | B2 * | 6/2020 | Powell ............... H03L 3/00 |
| 2014/0021987 | A1 | 1/2014 | Okada |

FOREIGN PATENT DOCUMENTS

JP        4948077 B2   6/2012
KR     102010434 B1   8/2019

OTHER PUBLICATIONS

J. B. Lechevallier et al. 'Fast & Energy Efficient Start-Up of Crystal Oscillators by Self-Timed Energy Injection' *IEEE Journal of Solid-State Circuits*, vol. 54, No. 11, pp. 3107-3117, Nov. 2019.
H. Esmaeelzadeh et al. 'A Quick Start-Up Technique for High-Q Oscillator Using Precisely Timed Energy Injection' *IEEE Journal of Solid-State Circuits*, vol. 54, No. 3, pp. 692-702, Mar. 2018.

* cited by examiner

*Primary Examiner* — Arnold M Kinkead
(74) *Attorney, Agent, or Firm* — Harness, Dickey & Pierce, P.L.C.

(57) ABSTRACT

An oscillator includes a crystal oscillation circuit configured to generate an oscillation signal having a natural frequency, an injection circuit configured to inject a first injection signal and a second injection signal into the crystal oscillation circuit, a dithering circuit configured to transmit a first control signal for generating the first injection signal to the injection circuit, and a phased-lock loop (PLL) circuit configured to lock a phase of the first injection signal to the natural frequency, to transmit a second control signal for generating the second injection signal to the injection circuit.

20 Claims, 12 Drawing Sheets

FIG. 1
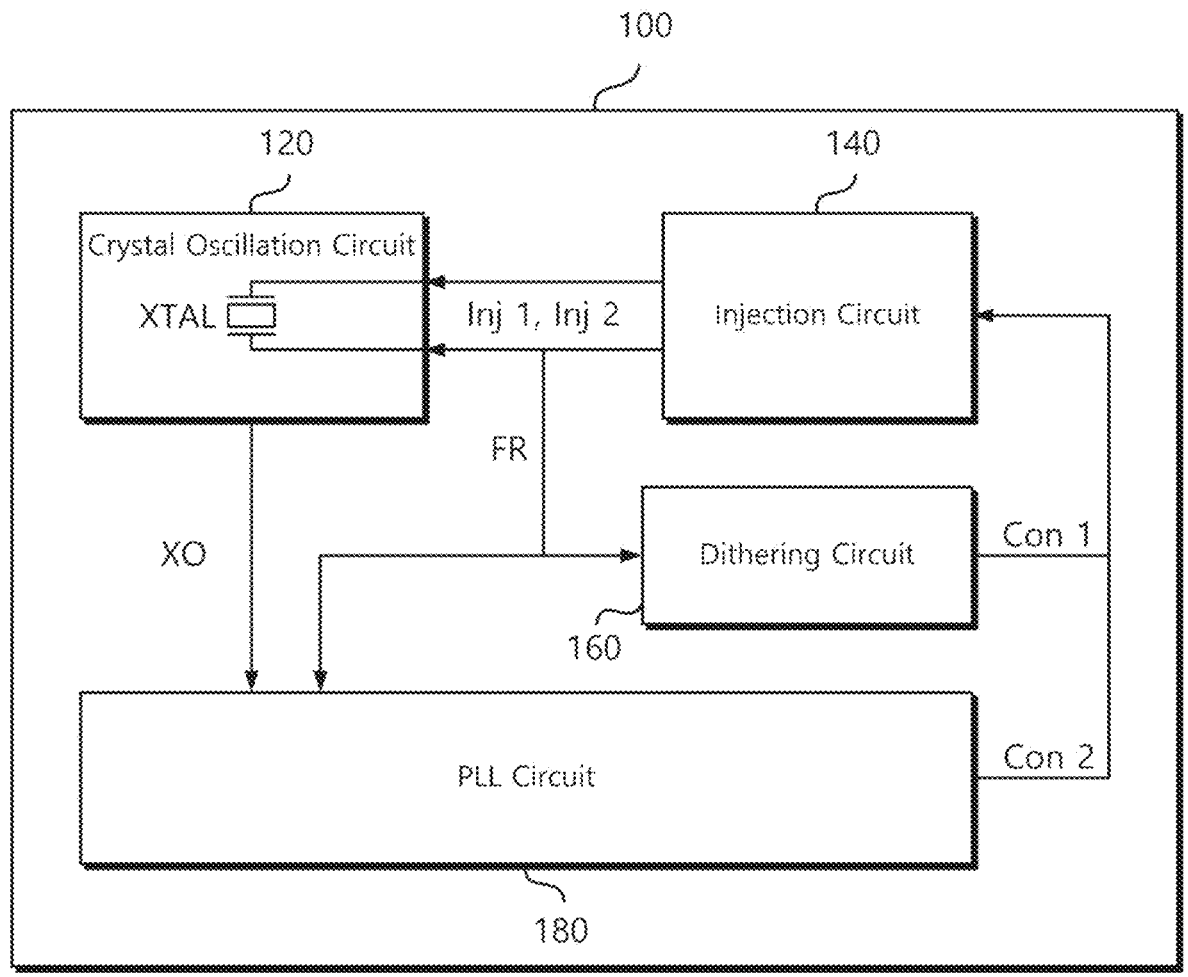
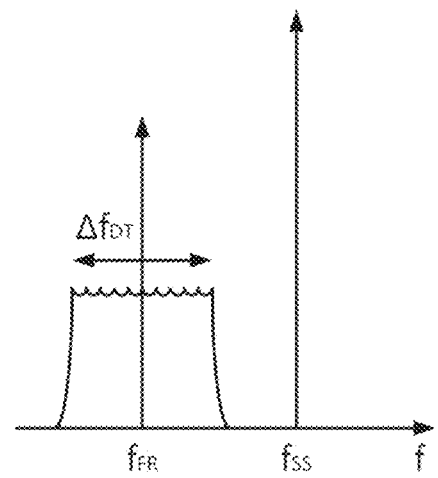
FIG. 2A

OSCILLATOR USING SAMPLING PLL-BASED INJECTION

CROSS-REFERENCE TO RELATED APPLICATIONS

This application claims priority under 35 U.S.C. § 119 to Korean Patent Application No. 10-2022-0029478 filed on Mar. 8, 2022, and Korean Patent Application No. 10-2022-0074250 filed on Jun. 17, 2022, in the Korean Intellectual Property Office, the disclosures of each of which are incorporated by reference herein in their entireties.

FIELD

Some example embodiments of the inventive concepts described herein relate to an oscillator, including an oscillator using a sampling PLL-based injection.

BACKGROUND

A low phase noise (PN) of a crystal oscillator (XO) is considered as an important factor in supporting a gradually increasing data rate. In order to achieve the low PN performance of the XO, it is desirable or necessary to maintain a sine wave with a large swing as well as a high quality (Q)-factor to reduce or avoid the noise influence of peripheral devices. However, in maintaining a large swing, the initial oscillation time creates a design trade-off relationship. Because such an initial oscillation time increases the standby time of a peripheral system, standby power consumed by the battery increases, which degrades the day-of-use (DOU) performance of a mobile device.

To improve the oscillation time, an injection-voltage controlled oscillator (i-VCO) is used such that it is possible to transfer energy in the vicinity of a similar resonant frequency band to the crystal, thereby reducing the oscillation time. However, for the low PN performance of an XO, a large swing of 1.2V or more desires or requires an error within 20 ppm of the frequency tolerance of the injection oscillator. Considering process, voltage and temperature (PVT) changes, it is difficult to design an injection oscillator with a frequency error of less than 20 ppm. In addition, in a scenario where the XO of the system does not operate, because there is no clock to use for compensation, it is also practically difficult to apply compensation to the injection oscillator.

SUMMARY

Some example embodiments of the inventive concepts provide an oscillator capable of reducing an oscillation time by using a sampling PLL-based injection.

According to an example embodiment, an oscillator includes a crystal oscillation circuit configured to generate an oscillation signal having a natural frequency, an injection circuit configured to inject a first injection signal and a second injection signal into the crystal oscillation circuit, a dithering circuit configured to transmit a first control signal for generating the first injection signal to the injection circuit, and a phased-lock loop (PLL) circuit configured to lock a phase of the first injection signal to the natural frequency, to transmit a second control signal for generating the second injection signal to the injection circuit.

According to another example embodiment, an electronic device includes an oscillator configured to generate an oscillation signal having a natural frequency by injecting a first injection signal and a second injection signal through a first phase, a second phase, a third phase and a fourth phase, and a finite state machine (FSM) configured to control the oscillator in the first to fourth phases. The oscillator includes a crystal oscillation circuit configured to generate the oscillation signal, an injection circuit configured to inject the first injection signal and the second injection signal into the crystal oscillation circuit in each of the first and fourth phases, a dithering circuit configured to transmit a first control signal for generating the first injection signal to the injection circuit in the first phase and the second phase, and a phased-lock loop (PLL) circuit configured to lock a phase of the first injection signal to the natural frequency in the third phase, to transmit a second control signal for generating the second injection signal to the injection circuit.

According to still another example embodiment, an electronic system includes an oscillator configured to generate an oscillation signal having a natural frequency by injecting a first injection signal and a second injection signal through a first phase, a second phase, a third phase and a fourth phase, an integrated circuit (IC) chip configured to convert the oscillation signal into at least one clock signal, and at least one external device configured to receive one of the at least one clock signal. The oscillator includes a crystal oscillation circuit configured to generate the oscillation signal, an injection circuit configured to inject the first injection signal and the second injection signal into the crystal oscillation circuit in each of the first and fourth phases, a dithering circuit configured to transmit a first control signal for generating the first injection signal to the injection circuit in the first phase and the second phase, and a phased-lock loop (PLL) circuit configured to lock a phase of the first injection signal to the natural frequency in the third phase, to transmit a second control signal for generating the second injection signal to the injection circuit.

According to some example embodiments, it is possible to provide an oscillator capable of shortening an oscillation time by using a sampling PLL-based injection.

BRIEF DESCRIPTION OF THE FIGURES

The above and other objects and features of inventive concepts will become apparent by describing in detail example embodiments thereof with reference to the accompanying drawings.

FIG. 1 is a block diagram illustrating an oscillator according to an example embodiment of the inventive concepts.

FIGS. 2A to 2D are diagrams illustrating a method of driving the oscillator of FIG. 1.

DETAILED DESCRIPTION

Figure 2B:
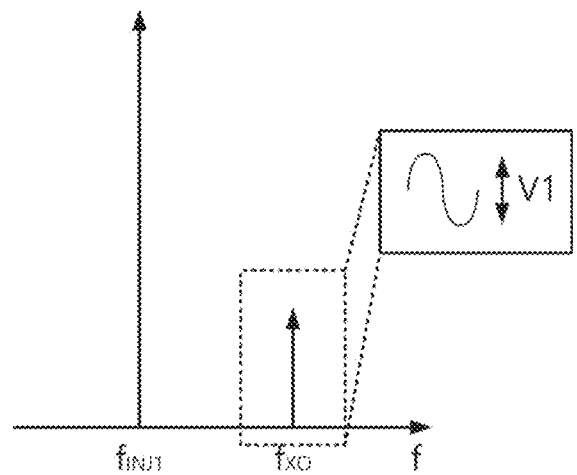

Hereinafter, various example embodiments of the inventive concepts will be described clearly and in detail, so that those skilled in the art can easily carry out the example embodiments of the inventive concepts.

FIG. 1 is a block diagram illustrating an oscillator according to an example embodiment of the inventive concepts.

Referring to FIG. 1, an oscillator 100 includes a crystal oscillation circuit 120, an injection circuit 140, a dithering circuit 160, and a phased-lock loop (PLL) circuit 180.

The crystal oscillation circuit 120 generates an oscillation signal XO having a natural frequency $f_{XO}$. The crystal oscillation circuit 120 may be configured to generate the oscillation signal XO corresponding to the natural frequency $f_{XO}$ of a crystal XTAL by allowing the crystal XTAL included therein to resonate. The crystal XTAL may have the natural frequency $f_{XO}$, and may include a quartz crystal, a piezoelectric crystal, a piezoelectric crystal vibrator, or other various types of resonant elements.

When a first injection signal Inj 1 and a second injection signal Inj 2 are injected from the injection circuit 140, respectively, the crystal oscillation circuit 120 generates the oscillation signal XO corresponding to each injection. In some example embodiments, when the first injection signal Inj 1 is injected, the crystal oscillation circuit 120 generates the oscillation signal XO having a first swing voltage V1 which is a primary target voltage, and when the second injection signal Inj 2 is injected, the crystal oscillation circuit 120 generates the oscillation signal XO having a second swing voltage V2 that is a final target voltage greater than the first swing voltage V1.

The injection circuit 140 is connected to the crystal oscillation circuit 120 and is configured to generate and inject the first injection signal Inj 1 and the second injection signal Inj 2 into the crystal oscillation circuit 120. The injection circuit 140 is connected to both ends of the crystal XTAL included in the crystal oscillation circuit 120 through two paths to inject the first injection signal Inj 1 and the second injection signal Inj 2.

The injection circuit 140 generates the first injection signal Inj 1 based on a first control signal Con 1 received from the dithering circuit 160. The first injection signal Inj 1 is generated through dithering based on the first control signal Con 1.

In some example embodiments, dithering means modulating an original signal based on a shaken control signal through a dithering signal having a specific frequency width $f_{DT}$. For example, the injection circuit 140 may modulate a free-running signal of the injection circuit 140 based on the first control signal Con 1 in which the original voltage is shaken through a dithering signal, thereby generating the first injection signal Inj 1. In some example embodiments, the first control signal Con 1 is a control signal used to dither the free-running signal FR. In addition, the injection of the first injection signal Inj 1 into the crystal oscillation circuit 120 through dithering may be understood as injection of energy of the first injection signal Inj 1 into the crystal oscillation circuit 120. When the energy of the first injection signal Inj 1 is injected through dithering, a time taken for the oscillation signal XO to reach a steady state signal having a specific target voltage may be reduced.

The injection circuit 140 generates the second injection signal Inj 2 based on a second control signal Con 2 received from the PLL circuit 180. The second control signal Con 2 is a signal for generating the second injection signal Inj 2 by locking the phase of the first injection signal Inj 1 to the natural frequency $f_{XO}$ of the crystal XTAL. That is, when the injection circuit 140 receives the second control signal Con 2, the injection circuit 140 generates the second injection signal Inj 2 whose phase is locked to the natural frequency $f_{XO}$.

According to an example embodiment, the injection circuit 140 may sequentially inject the first injection signal Inj 1 and the second injection signal Inj 2 into the crystal oscillation circuit 120. The injection circuit 140 may inject the first injection signal Inj 1 in a specific phase, and inject the second injection signal Inj 2 in the phase after a specific phase, that is, after the first injection signal Inj 1 is injected.

The dithering circuit 160 generates the first control signal Con 1 for generating the first injection signal Inj 1 and transmits it the injection circuit 140. The dithering circuit 160 receives the free-running signal FR from the injection circuit 140, generates the first control signal Con 1 based on the received free-running signal FR, and transmits the first control signal Con 1 to the injection circuit 140.

The PLL circuit 180 locks the phase of the first injection signal Inj 1 to the natural frequency $f_{XO}$ to generate the second control signal Con 2 for generating the second injection signal Inj 2 and transmits it to the injection circuit 140. The PLL circuit 180 obtains a sampling voltage VSH by performing a sample and hold operation on the oscillation signal XO and the first injection signal Inj 1, and uses the sampling voltage VSH to generate the second control signal Con 2 based on the sampling PLL operation of locking the phase of the first injection signal Inj 1 to the natural frequency $f_{XO}$.

According to an example embodiment, the oscillator 100 according to the inventive concepts described above may inject the first injection signal Inj 1 and the second injection signal Inj 2 in the first to fourth phases to generate the oscillation signal XO having the natural frequency $f_{XO}$.

FIGS. 2A to 2D are diagrams illustrating a method of driving the oscillator of FIG. 1.

FIGS. 2A to 2D correspond to the first to fourth phases, respectively.

Referring to FIG. 2A, in the first phase, the first injection signal Inj 1 is injected into the crystal oscillation circuit 120 through dithering based on the dithering circuit 160 and the injection circuit 140. The first phase may also be referred to as the first injection phase. The free-running signal FR of the injection circuit 140 having a free-running frequency $f_{FR}$ has a deviation according to the PVT relative to the steady-state signal having a steady-state frequency $f_{SS}$. For example, the free-running frequency $f_{FR}$ may have different frequency deviations at room temperature, high temperature and low temperature, respectively. Therefore, preferably, the dithering for the free-running frequency $f_{FR}$ is performed with a dithering signal having the specific frequency width $f_{DT}$ corresponding to the frequency error according to the PVT of the free-running frequency $f_{FR}$.

Continuously, referring to FIG. 2B, in the second phase, the oscillation signal XO has the first swing voltage V1 as the primary target voltage through dithering of the first phase. The second phase may be referred to as a PLL stand-by phase. For example, as illustrated, the oscillation signal XO may be a sine wave having the first swing voltage V1. Because a first injection frequency $f_{INJ1}$ of the first injection signal Inj 1 and the natural frequency $f_{XO}$ of the oscillation signal XO have a relatively large frequency error, the injection efficiency through dithering is relatively low so that the oscillation signal XO may not reach a large swing voltage (e.g., the second swing voltage V2) immediately, but it is possible to allow the oscillation signal XO to reach the first swing voltage V1 which is the primary target voltage.

Figure 2C:
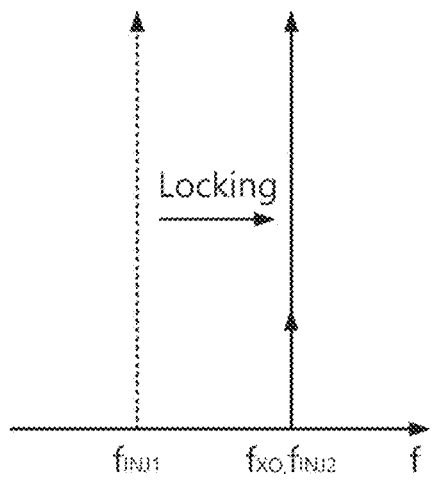

Referring to FIG. 2C, in the third phase, the sampling PLL operation performed through the PLL circuit 180 and the injection circuit 140 is performed. The third phase may be referred to as a PLL phase. The second injection signal Inj 2 is generated by locking the phase of the first injection signal Inj 1 to the natural frequency $f_{XO}$ through the third phase. As illustrated, the phase of the second injection signal Inj 2 is equal to the natural frequency $f_{XO}$.

Figure 2D:
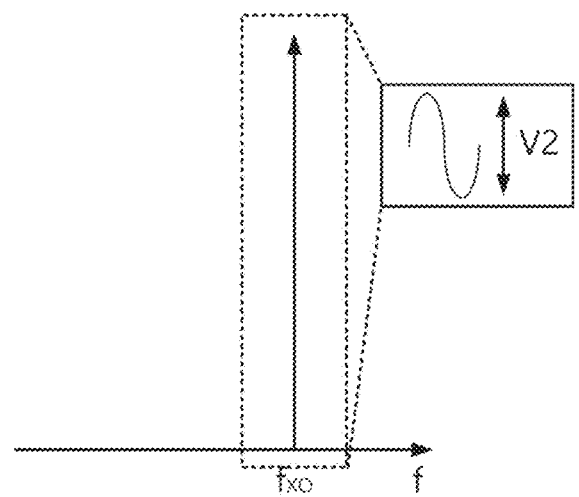

Referring to FIG. 2D, in the fourth phase, the second injection signal Inj 2 is re-injected into the crystal oscillation circuit 120 through the injection circuit 140. The fourth phase may also be referred to as the second injection phase. The oscillation signal XO has the second swing voltage V2, which is the final target voltage, through the fourth phase and reaches a steady state. For example, as illustrated, the oscillation signal XO may be a sine wave having the second swing voltage V2.

As described above, the oscillator 100 according to the example embodiment of the inventive concepts was examined. According to the oscillator 100 according to an example embodiment of the inventive concepts, the injection of the injection signal may proceed in two stages. Through the two-stage injection operation, the oscillation time of the crystal oscillation circuit 120 may be reduced and the energy required for oscillation may also be reduced. In particular, the oscillator 100 according to an example embodiment of the inventive concepts may compensate for the frequency deviation of the free-running signal FR of the injection circuit 140 through dithering in the primary injection operation, and it is possible to generate an injection signal having a frequency exactly corresponding to the oscillation signal XO through the sampling PLL in the secondary injection operation, so that the oscillation time may be improved insensitive to PVT.

Hereinafter, a detailed operation of each component included in the above-described oscillator 100 will be described.

Figure 3:
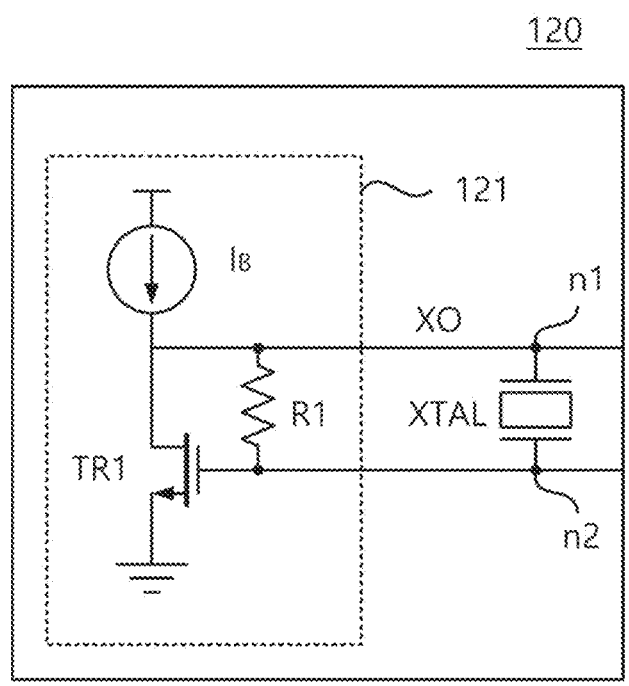
FIG. 3 is a diagram showing a crystal oscillation circuit included in the oscillator of FIG. 1.

FIG. 3 is a diagram showing a crystal oscillation circuit included in the oscillator of FIG. 1.

Referring to FIG. 3, the crystal oscillation circuit 120 includes a crystal XTAL and a first transconductance cell 121.

As described above, the crystal XTAL has the natural frequency $f_{XO}$ and is oscillated by the first transconductance cell 121.

The first transconductance cell 121 is connected to a first node n1 and a second node n2, which are both ends of the crystal XTAL, to perform an oscillation operation in which the crystal XTAL resonates at the natural frequency $f_{XO}$.

According to an example embodiment, the first transconductance cell 121 may include a current source IB connected to the first node n1, a first transistor TR1 having a drain connected to the first node n1, a gate connected to the second node n2 and a width W, and a first resistor R1 connected between the drain and the gate of the first transistor TR1 to form a feedback loop. The first transconductance cell 121 generates the oscillation signal XO having the natural frequency $f_{XO}$ by performing an oscillation operation through the feedback loop. The first transconductance cell 121 shown in FIG. 3 is merely an example, and may be variously configured to perform an oscillation operation capable of generating the oscillation signal XO corresponding to the natural frequency $f_{XO}$ through the oscillation operation.

Figure 4:
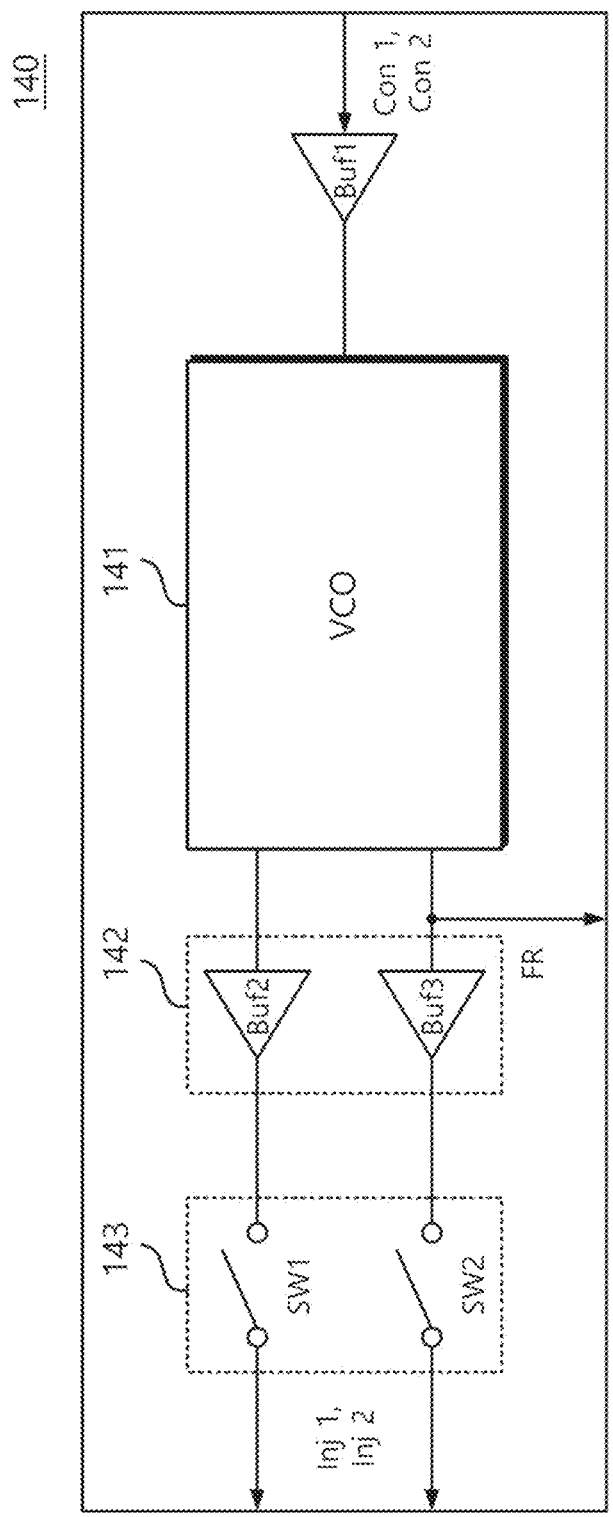
FIG. 4 is a diagram illustrating an injection circuit included in the oscillator of FIG. 1.

FIG. 4 is a diagram illustrating an injection circuit included in the oscillator of FIG. 1.

Referring to FIG. 4, the injection circuit 140 includes a first buffer Buf 1, a voltage controlled oscillator 141, a buffer unit 142, and a switching unit 143.

The first buffer Buf 1 receives the first control signal Con 1 and the second control signal Con 2 from the injection circuit 140 and the PLL circuit 180 and performs buffering.

When the first control signal Con 1 and the second control signal Con 2 are received from the first buffer Buf 1, the voltage controlled oscillator 141 performs an oscillation operation according to each control signal to generate the first injection signal Inj 1 and the second injection signal Inj 2. For example, the voltage controlled oscillator 141 may be implemented in various forms, such as a ring voltage-controlled oscillator and an inductor-capacitor (LC) oscillator.

The buffer unit 142 includes a second buffer Buf 2 and a third buffer Buf 3, and buffers the first injection signal Inj 1 and the second injection signal Inj 2 generated from the voltage controlled oscillator 141 to transmit the first injection signal Inj 1 and the second injection signal Inj 2 to the switching unit 143.

The switching unit 143 is connected to the buffer unit 142 and the crystal oscillation circuit 120 to inject the first injection signal Inj 1 and the second injection signal Inj 2 to the crystal oscillation circuit 120 according to the switching operation. The switching unit 143 includes a first switch SW1 and a second switch SW2 connected to both ends of the crystal XTAL. The first switch SW1 and the second switch SW2 are turned on in the first phase to inject the first injection signal Inj 1 into the crystal oscillation circuit 120, or are turned on in the fourth phase to inject the second injection signal Inj 2 into the crystal oscillation circuit 120.

Figure 5:
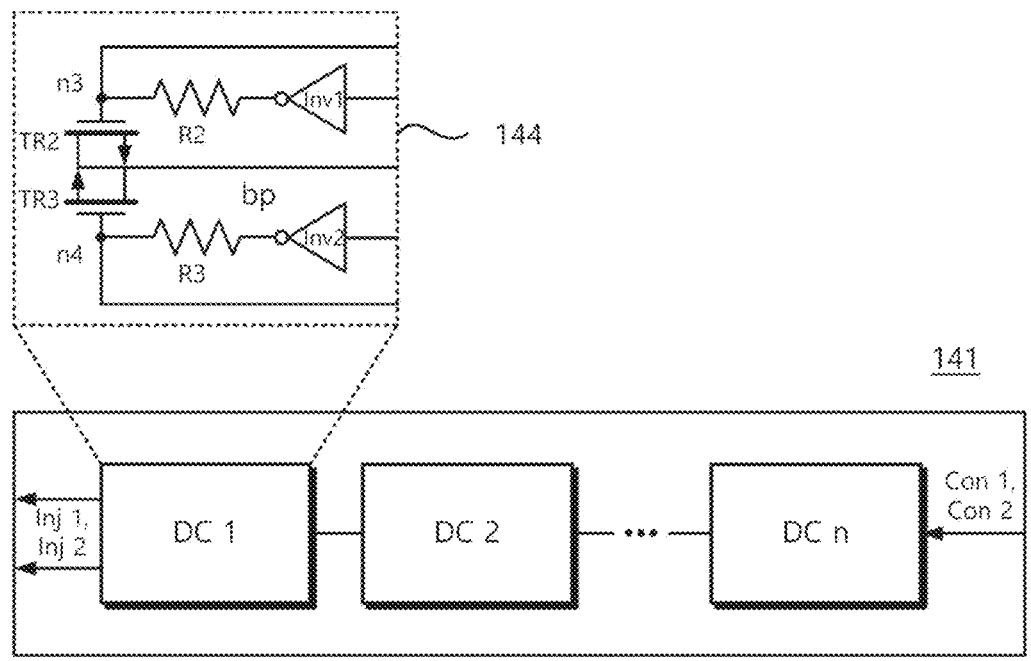
FIG. 5 is a diagram illustrating a voltage controlled oscillator according to an example embodiment.

FIG. 5 is a diagram illustrating a voltage controlled oscillator according to an example embodiment.

Referring to FIG. 5, the voltage controlled oscillator 141 according to an example embodiment may be a ring oscillator including a resistor-capacitor (RC) time constant-based delay cell (DC) having a relatively small frequency deviation for PVT. The voltage controlled oscillator 141 may include a plurality of delay cells DC 1, DC 2, . . . , DC n. Among the plurality of delay cells DC 1, DC 2, . . . , DC n, the n-th delay cell provided at an input terminal of the injection circuit 140 receives the first control signal Con 1 and the second control signal Con 2, and the first delay cell provided at an output terminal of the injection circuit 140 outputs the first injection signal Inj 1 and the second injection signal Inj 2 generated based on the oscillation operation. The first control signal Con 1 and the second control signal Con 2 are commonly applied to the plurality of delay cells DC 1, DC 2, . . . , DC n through one line bp.

Each delay cell 144 included in the plurality of delay cells DC 1, DC 2, . . . , DC n according to an example embodiment may include a first inverter Inv 1, a second inverter Inv 2, a second resistor R2 connected to the first inverter Inv 1 and the third node n3, a third resistor R3 connected to the second inverter Inv 2 and the fourth node n4, a second transistor TR2 having a gate connected to the third node n3, and a third transistor TR3 having a gate connected to the fourth node n4. The first inverter Inv 1, the second resistor R2 and the second transistor TR2, and the second inverter Inv 2, the third resistor R3 and the third transistor TR3 may be formed in a differential structure. The sources and gates of the second transistor TR2 and the third transistor TR3 may be biased through one line bp, and the second transistor TR2 and the third transistor TR3 may operate as a varactor capacitor which varies according to a voltage. Even when implemented as a small RC time constant-based delay cell, frequency drift according to PVT may be caused. To alleviate this, the bias voltage of one line bp may be adjusted based on the temperature proportional voltage VPT proportional to the absolute temperature, so that it is possible to compensate for the frequency drift according to PVT.

Figure 6A:
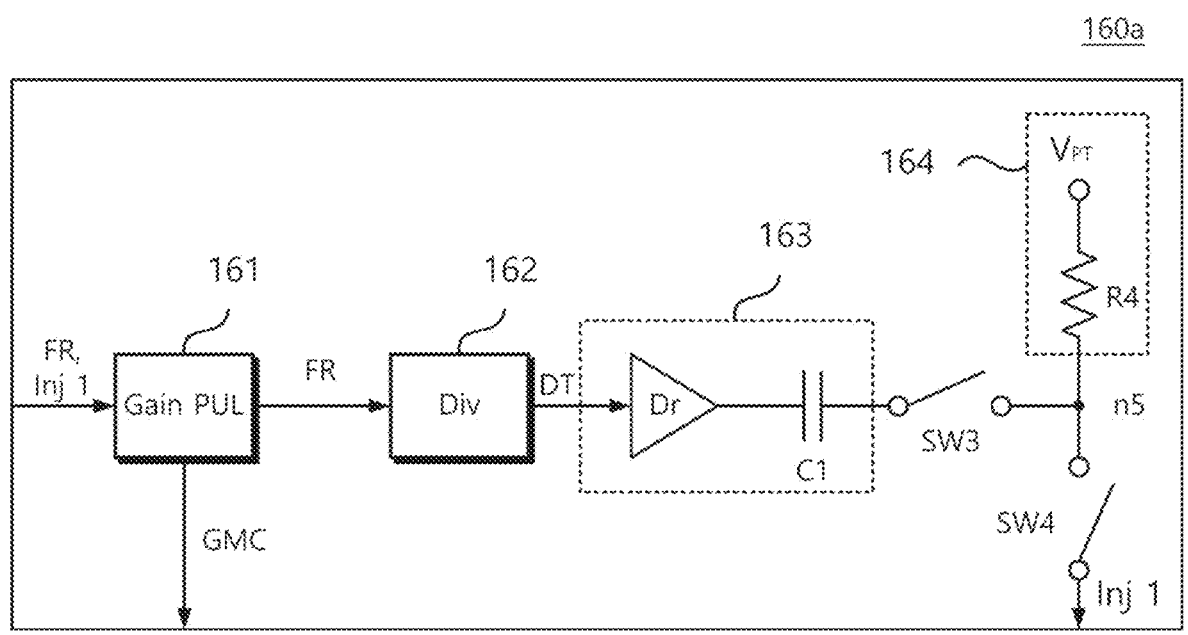
FIGS. 6A and 6B are diagrams illustrating a dithering circuit according to example embodiments of the inventive concepts.
Figure 6B:
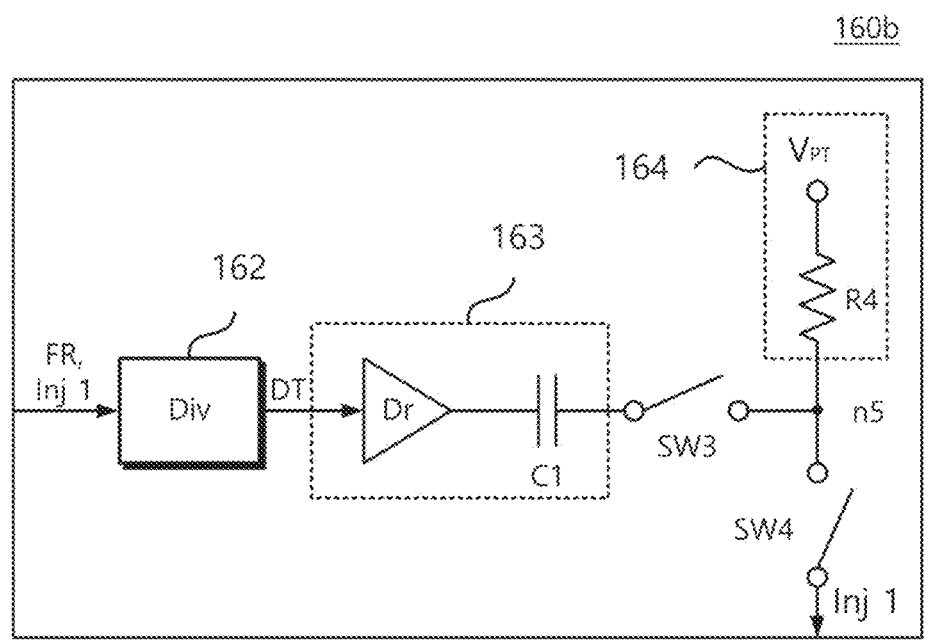

FIGS. 6A and 6B are diagrams illustrating a dithering circuit according to example embodiments of the inventive concepts.

Referring to FIG. 6A, first, a dithering circuit 160a according to an example embodiment of the inventive concepts includes a gain adjustment unit 161, a divider 162, an AC-coupling circuit 163, a third switch SW3, a DC-coupling circuit 164, and a fourth switch SW4.

The gain adjustment unit 161 may be connected to the injection circuit 140 (specifically, the voltage controlled oscillator 141) and the PLL circuit 180, and control a loop gain of the PLL circuit 180 based on the first injection signal Inj 1. In addition, the gain adjustment unit 161 may be configured to receive the free-running signal FR from the injection circuit 140 and transmit the free-running signal FR to the divider 162. The gain value of the output which is output through the sampling PLL operation of the PLL circuit 180 may have a rather large value. In some example embodiments, the stability of the PLL circuit 180 may be deteriorated and the locking time may not be constant depending on the PVT. Accordingly, the gain adjustment unit 161 may output a gain control signal GMC to the PLL circuit 180 to decrease the gain value of the output of the PLL circuit 180, thereby increasing the stability of the PLL circuit 180 and adjusting the locking time to be constant or substantially constant.

The divider 162 may divide the free-running signal FR of the voltage controlled oscillator 141 by value N (where N is a natural number) to generate a dithering signal having a specific frequency range. In some example embodiments, the value N may be determined according to the dithering range required for the oscillator 100, that is, a specific frequency range.

The dithering signal generated by the divider 162 may be AC-coupled through the AC-coupling circuit 163. According to an example embodiment, the AC-coupling circuit 163 may include a driver Dr and a first capacitor C1 for filtering a dithering signal to remove a DC component and performing AC-coupling.

The third switch SW3 is connected to the AC-coupling circuit 163 to pass the dithering signal according to the switching operation. The third switch SW3 may be turned on in the first phase, which is the first injection phase, to pass the dithering signal to a fifth node n5. The third switch SW3 is turned off in the second phase to stop applying the dithering signal.

The DC-coupling circuit is connected to the third switch SW3 through the fifth node n5 to DC-couple a temperature proportional voltage VPT proportional to the absolute temperature of the voltage controlled oscillator 141 and bias the dithering signal to the temperature proportional voltage VPT. The dithering signal biased to the temperature proportional voltage VPT may correspond to the above-described first control signal Con 1. As described above, the temperature proportional voltage VPT may be used to solve the problem that the free-running frequency $f_{FR}$ of the voltage controlled oscillator 141 may have a deviation according to the PVT, and the bias voltage of the voltage controlled oscillator 141 may be adjusted based on the temperature proportional voltage VPT DC-coupled to the dithering signal.

The fourth switch SW4 is connected to the AC-coupling circuit 163 and the DC-coupling circuit 164 through the fifth node n5 and passes the dithering signal, that is, the first control signal Con 1, biased to the temperature proportional voltage VPT according to the switching operation. The fourth switch SW4 may be turned on in the first phase to transmit the first control signal Con 1 to the injection circuit 140. Alternatively, the fourth switch SW4 may be turned on in the second phase, which is the PLL preparation phase, and the voltage of the first control signal Con 1 may be set to be the same as the temperature proportional voltage VPT to prepare the sampling PLL performed in the third phase in future.

Next, referring to FIG. 6B, a dithering circuit 160b according to another example embodiment of the inventive concepts may be implemented by removing the gain adjustment unit 161 of FIG. 6A. In some example embodiments, the free-running signal FR is directly applied to the divider 162 and the divider 162 divides the free-running signal FR to generate the dithering signal.

According to the example embodiments of the inventive concepts, the dithering circuits 160a and 160b of FIGS. 6A and 6B described above may use the AC-coupled dithering signal and the DC-coupled temperature proportional voltage VPT to generate the first control signal Con 1, thereby reducing the dithering range required in the first phase. Because the frequency deviation according to the PVT is reduced through the temperature proportional voltage VPT, the energy to be injected through dithering may be reduced as much as possible, and thus the time of the first phase, that is, the dithering time may also be reduced.

In addition, because the dithering circuit 160a of FIG. 6A includes a gain adjustment unit 161 that can adjust the gain of the PLL circuit 180 when the gain of the PLL circuit 180 is relatively large, the stability of the circuit may be increased and the time required for locking may also be constantly adjusted. In the dithering circuit 160b of FIG. 6B, when there is no desire or need for gain adjustment because the gain of the PLL circuit 180 is relatively small, the gain adjustment unit 161 may be removed so that it is possible to reduce the complexity when implementing integrated-circuit (IC).

Figure 7A:
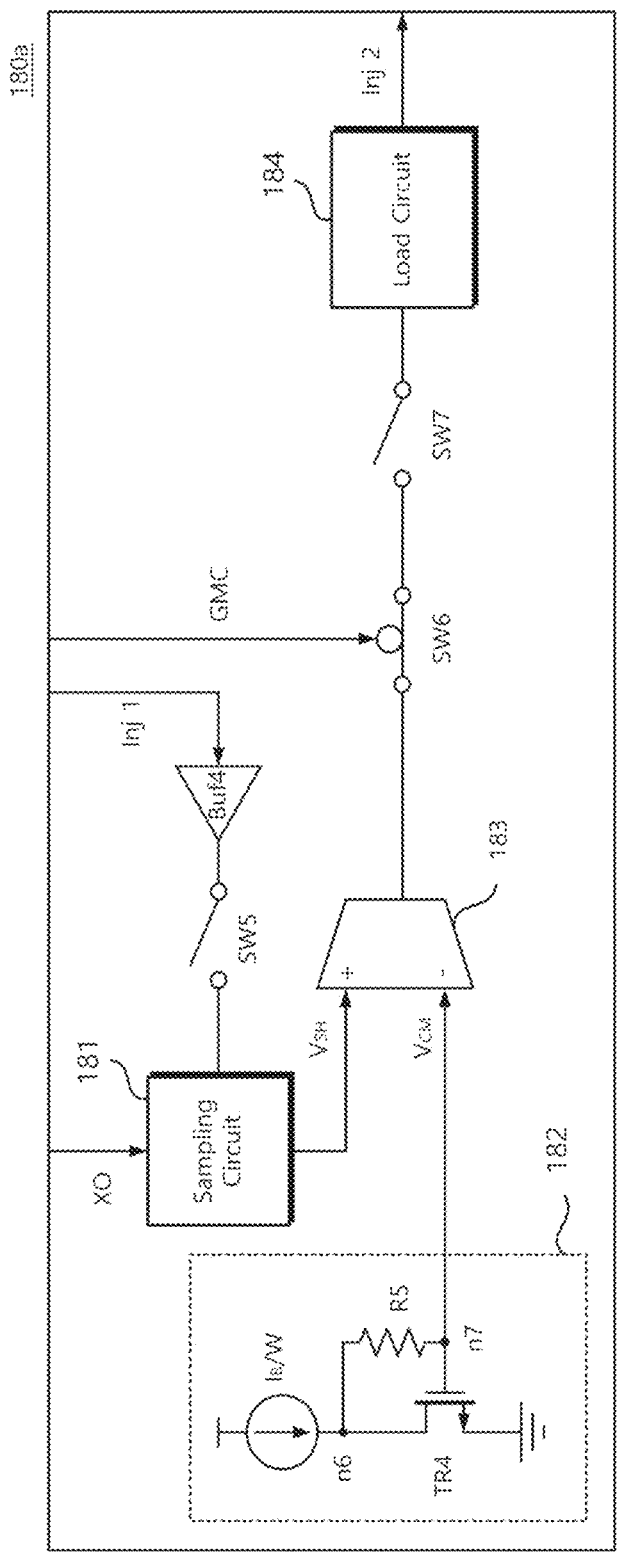
FIGS. 7A and 7B are diagrams illustrating PLL circuits according to example embodiments of the inventive concepts.
Figure 7B:
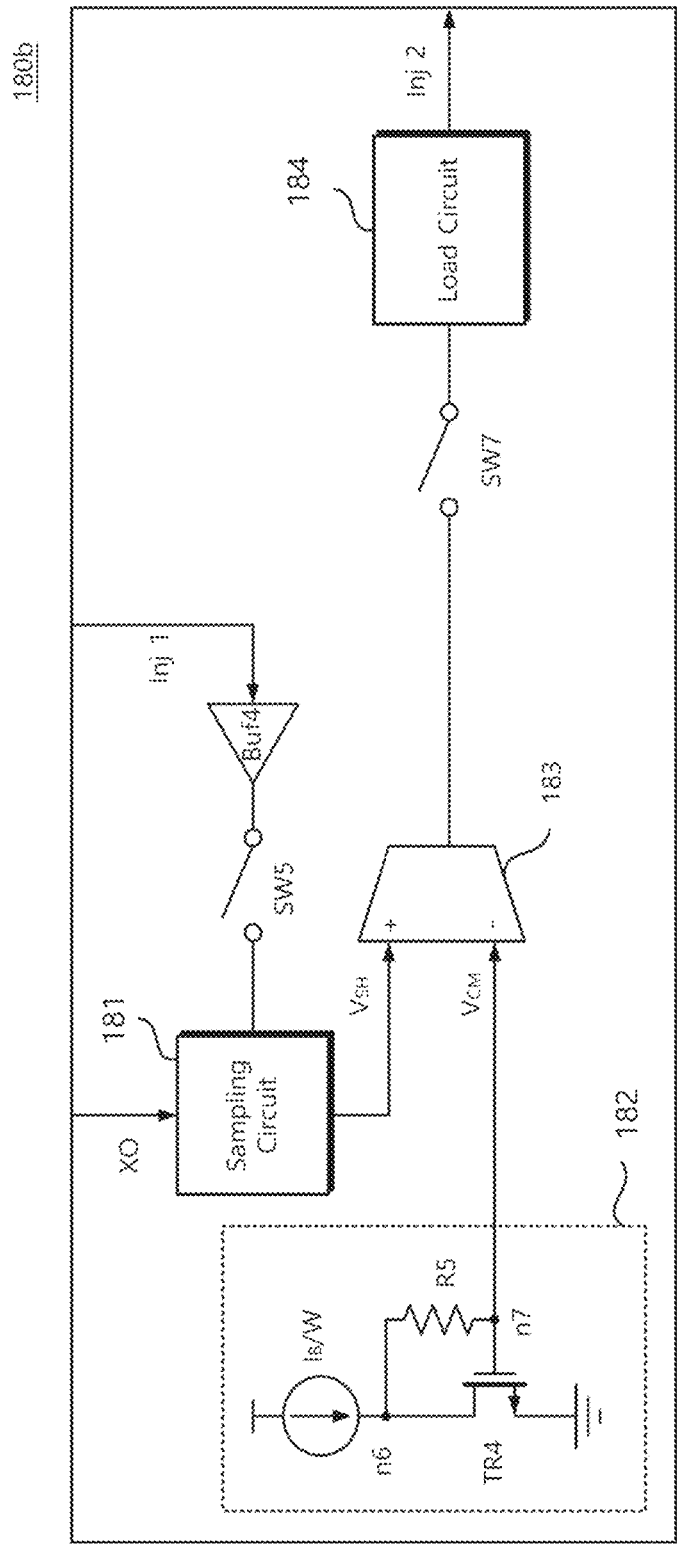

FIGS. 7A and 7B are diagrams illustrating PLL circuits according to example embodiments of the inventive concepts.

Each of PLL circuits 180a and 180b of FIGS. 7A and 7B may be configured to sample the oscillation signal XO to obtain the sampling voltage VSH, and compare the sampling voltage VSH with a reference voltage VCM to adjust the second control signal Con 2 until the sampling voltage VSH reaches the reference voltage VCM.

First, referring to FIG. 7A, the PLL circuit 180a according to an example embodiment of the inventive concepts includes a fourth buffer Buf 4, a fifth switch SW5, a sampling circuit 181, a reference voltage providing circuit 182, a second transconductance cell 183, a sixth switch SW6, a seventh switch SW7, and a load circuit 184.

The fourth buffer Buf 4 buffers the first injection signal Inj 1 and transmits it to the fifth switch SW5.

The fifth switch SW5 is connected to the injection circuit 140 through the fourth buffer Buf 4 and passes the first injection signal Inj 1 according to the switching operation. The fifth switch SW5 is turned on in the third phase to transmit the first injection signal Inj 1 to the sampling circuit 181.

The sampling circuit 181 is connected to the fifth switch SW5 and the crystal oscillation circuit 120, and samples the oscillation signal XO based on the first injection signal Inj 1 to obtain the sampling voltage VSH. The sampling circuit 181 samples and holds the oscillation signal XO based on the first injection signal Inj 1 to obtain the sampling voltage VSH corresponding to phase information. For example, when the first injection signal Inj 1 is a square wave, the sampling circuit 181 may sample the oscillation signal XO, which is a sine wave, at a time corresponding to a rising edge or a falling edge and hold the sampling voltage VSH.

The reference voltage providing circuit 182 is configured to provide the reference voltage VCM to the second transconductance cell 183.

According to an example embodiment, the reference voltage providing circuit 182 has a current source IB/W connected to a sixth node n6, a fourth transistor TR4 having a drain connected to the sixth node n6 and a gate connected to a seventh node n7, and a fifth resistor R5 connected between the drain and the gate of the fourth transistor TR4 to form a feedback loop. The reference voltage providing circuit 182 is implemented as a duplicate cell of the first transconductance cell 121 to extract the reference voltage VCM from the oscillation signal XO. According to an example embodiment, the current source IB/W may have a size corresponding to 1/W times the current source included in the first transconductance cell 121 described above, and the width of the fourth transistor TR4 may be 1/W times the width of the first transistor TR1 included in the first transconductance cell 121.

The second transconductance cell 183 compares the sampling voltage VSH and the reference voltage VCM to generate the second control signal Con 2 according to the comparison result. The second control signal Con 2 may be generated until the sampling voltage VSH becomes equal or substantially equal to the reference voltage VCM. The phase of the first injection signal Inj 1 may be locked to the natural frequency fXO when the sampling voltage VSH reaches the reference voltage VCM.

The sixth switch SW6 passes the second control signal Con 2 generated from the second transconductance cell 183 according to the switching operation. Specifically, the sixth switch SW6 receives the gain control signal GMC from the above-described gain adjustment unit 161 and performs an on/off operation according to the gain control signal GMC. As described above, the output of the second transconductance cell 183, that is, the gain of the second control signal Con 2, may be controlled according to the on/off of the sixth switch SW6.

The seventh switch SW7 is connected to the sixth switch SW6 and passes the second control signal Con 2 according to the switching operation. The seventh switch SW7 is turned on in the third phase to transmit the second control signal Con 2 to the load circuit 184.

The load circuit 184 may be configured to correspond to the load of the PLL circuit 180*a*, that is, the load and be connected to the seventh switch SW7 to provide a pole and a zero point of the PLL circuit 180*a*.

Next, referring to FIG. 7B, the PLL circuit 180*b* according to another example embodiment of the inventive concepts may be implemented by removing the sixth switch SW6 of FIG. 7A. In this case, the second control signal Con 2 is directly applied to the seventh switch SW7.

The second transconductance cell 183 shown in FIGS. 7A and 7B described above is merely an example, and may be variously configured to extract the reference voltage VCM.

Because the above-described PLL circuits 180*a* and 180*b* of FIGS. 7A and 7B according to the example embodiments may extract phase information through a sample and hold operation, they may directly sample the oscillation signal XO which is a sine wave even when there is no buffer for a reference clock, and may perform the locking operation. In addition, when performing the locking operation through a sample and hold operation, a large gain may be achieved with relatively low power consumption compared to a conventional PLL using a square wave, so that it is possible to widen the loop bandwidth of the PLL and reduce the locking time.

In addition, in the PLL circuit 180*a* of FIG. 7A, the gain of the second transconductance cell 183 may be adjusted according to the gain control signal GMC, thereby increasing the stability of the PLL circuit 180 and the time required for locking may also be adjusted to be constant. In the PLL circuit 180*b* of FIG. 7B, when there is no need for gain adjustment because the gain of the PLL circuit 180 is relatively small, it is possible to reduce the complexity of implementing the IC by removing the sixth switch SW6.

Figure 8:
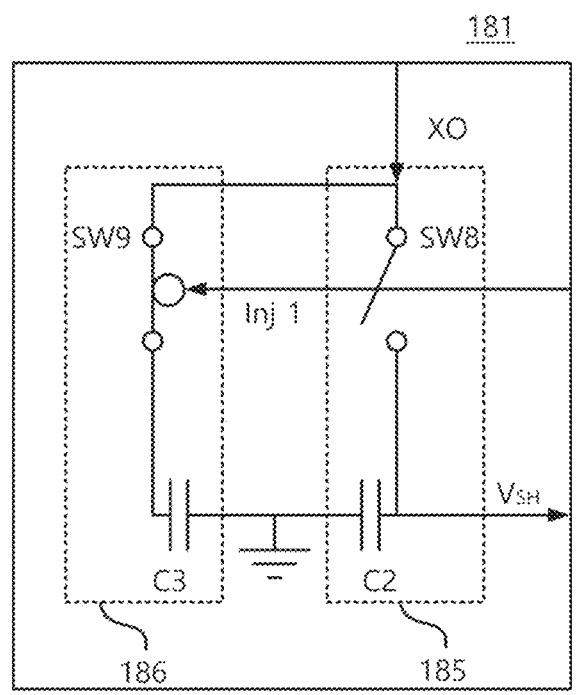
FIG. 8 is a diagram illustrating sampling circuits included in the PLL circuits of FIGS. 7A and 7B.

FIG. 8 is a diagram illustrating sampling circuits included in the PLL circuits of FIGS. 7A and 7B.

Referring to FIG. 8, the sampling circuit 181 includes a sample and hold circuit 185 including an eighth switch SW8 that performs a switching operation according to the first injection signal Inj 1 and a second capacitor C2, and a dummy circuit 186 connected to the sample and hold circuit 185 to have a differential structure. The second capacitor C2 is charged while the eighth switch SW8 is turned on/off according to the clock of the first injection signal Inj 1, and the sample and hold circuit 185 obtains the sampling voltage VSH through the second capacitor C2. The dummy circuit 186 may include a ninth switch SW9 and a third capacitor C3 connected to the sample and hold circuit 185 to have a differential structure, and provide the same or substantially the same structure as the sample and hold circuit 185 in terms of the crystal oscillation circuit 120 when the eighth switch SW8 is turned off, so that it is possible to inhibit or prevent the frequency fluctuation of the oscillation signal XO. The sampling circuit 181 of FIG. 8 is merely an example, and may have various structures capable of acquiring the sampling voltage VSH through a sample and hold operation.

Hereinafter, an electronic device 1000 and an electronic system 2000 including the oscillator 100 according to various example embodiments of the inventive concepts described above will be described. Duplicate descriptions of the same components will be omitted below.

Figure 9:
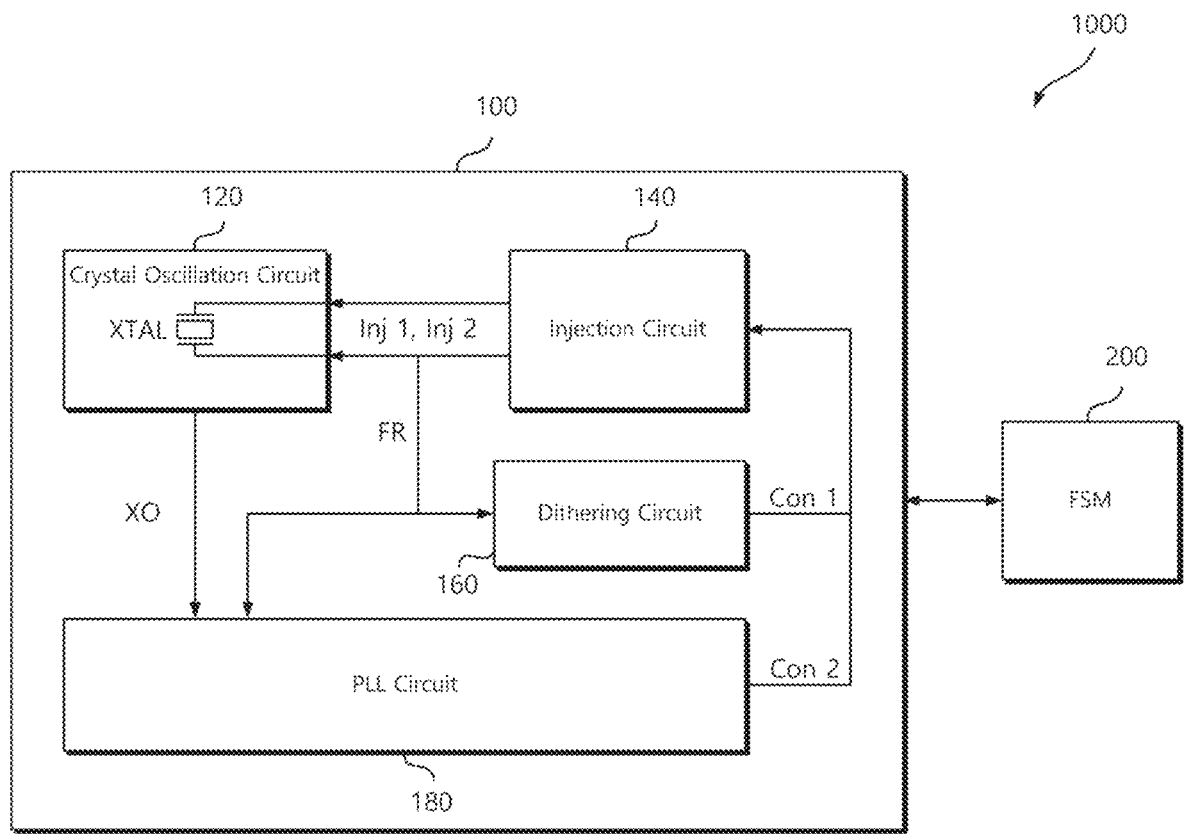
FIG. 9 is a diagram illustrating an electronic device according to an example embodiment of the inventive concepts.

FIG. 9 is a diagram illustrating an electronic device according to an example embodiment of the inventive concepts.

Referring to FIG. 9, the electronic device 1000 includes the oscillator 100 and a free-state-machine (FSM) 200.

As described above, the oscillator 100 injects the first injection signal Inj 1 and the second injection signal Inj 2 through the first to fourth phases to generate the oscillation signal XO having the natural frequency $f_{XO}$.

The FSM 200 is connected to the oscillator 100 and configured to control the oscillator 100 in the first to fourth phases. The FSM 200 may be referred to as a finite state machine. The FSM 200 may control the oscillator 100 by using the first to fourth sequences. Each of the first to fourth sequences may be defined as a sequence for controlling the oscillator 100 in the first to fourth phases. The FSM 200 may generate the first to fourth sequences based on the dithering signal generated from the oscillator 100. For example, when the dithering signal is generated, the FSM 200 may sequentially generate the first to fourth sequences having lengths corresponding to time ranges of the first to fourth phases.

Figure 10:
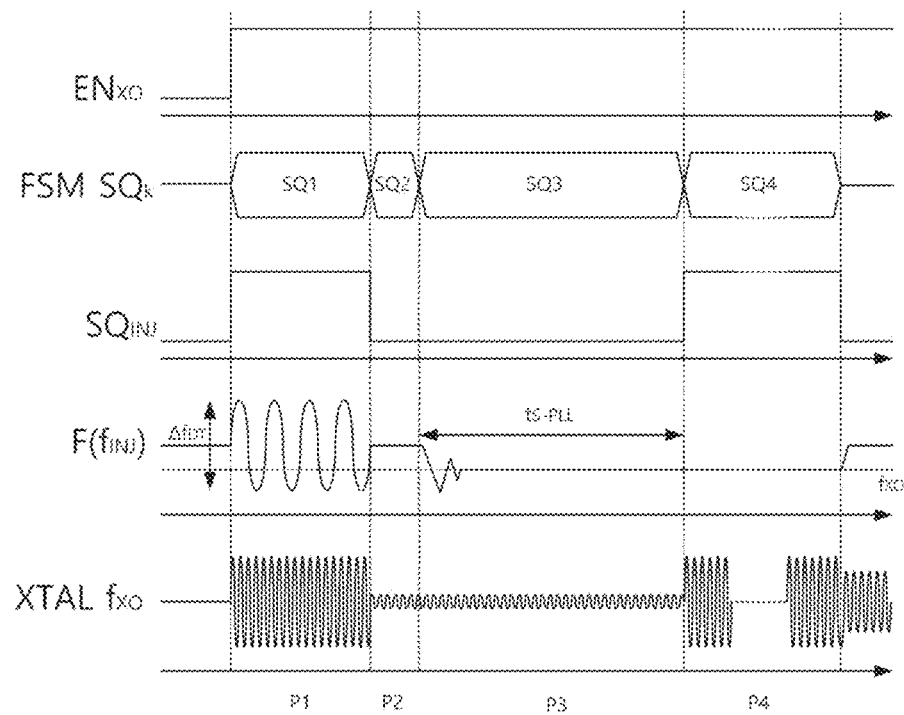
FIG. 10 is a diagram illustrating an operation of the electronic device of FIG. 9.

FIG. 10 is a diagram illustrating an operation of the electronic device of FIG. 9.

Referring to FIG. 10, when the crystal XTAL included in the oscillator 100 is enabled by an enabling signal $EN_{XO}$, a first phase P1 starts.

In the first phase P1, the FSM 200 generates a first sequence SQ1. In the first sequence SQ1, the oscillator 100 is controlled such that the injection circuit 140 injects the first injection signal Inj 1 into the crystal oscillation circuit 120 in the first phase P1, or the dithering circuit 160 transmits the first control signal Con 1 to the injection circuit 140 in the first phase P1. When an injection sequence $SQ_{INJ}$ included in the first sequence SQ1 is activated in the first phase P1, the FSM 200 turns on the switching unit 143 to inject the first injection signal Inj 1 to the crystal oscillation circuit 120. In addition, the FSM 200 turns on the third switch SW3 and the fourth switch SW4 to pass the dithering signal, and performs AC-coupling and DC-coupling. Because an injection function $F(f_{INJ})$ representing the injection signal corresponds to the first control signal Con 1, it may be confirmed that a sine wave having the frequency width $f_{DT}$ of the dithering signal is output. Because the oscillation signal XTAL $f_{XO}$ is included in an injection stage, it may be confirmed that energy is injected.

In a second phase P2, the FSM 200 generates a second sequence SQ2. In the second sequence SQ2, the oscillator 100 is controlled such that the dithering circuit 160 transmits the first control signal Con 1 for generating the first injection signal Inj 1 through dithering in the second phase P2 to the injection circuit 140. The FSM 200 turns on the fourth switch SW4 to pass the dithering signal. In the second phase P2, as described above, because the first control signal Con 1 becomes equal or substantially equal to the temperature proportional voltage VPT, it may be confirmed that the injection function $F(f_{INJ})$ has a constant or substantially constant value. In addition, the oscillation signal XTAL $f_{XO}$ has the first swing voltage V1 after the primary injection is completed.

In a third phase P3, the FSM 200 generates a third sequence SQ3. In the third sequence SQ3, the oscillator 100 is controlled such that the PLL circuit 180 locks the phase of the first injection signal Inj 1 to the natural frequency $f_{XO}$ in the third phase P3 and transmits the second control signal Con 2 for generating the second injection signal Inj 2 to the injection circuit 140. The FSM 200 turns on the fifth switch SW5 to pass the first injection signal Inj 1, and turns on the seventh switch SW7 to pass the second control signal Con 2. It may be confirmed that the injection function $F(f_{INJ})$ is locked at the natural frequency $f_{XO}$ in the third phase P3, and because it is based on the sampling PLL operation, the required locking time may be reduced.

In a fourth phase P4, the FSM 200 generates a fourth sequence SQ4. In the fourth sequence SQ4, the oscillator 100 is controlled such that the injection circuit 140 injects the second injection signal Inj 2 into the crystal oscillation circuit 120 in the fourth phase P4. When the injection sequence $SQ_{INJ}$ included in the fourth sequence SQ4 is activated in the fourth phase P4, the FSM 200 turns on the switching unit 143 to inject the second injection signal Inj 2 to the crystal oscillation circuit 120. Because the oscillation signal XTAL $f_{XO}$ is in an injection stage, it may be confirmed that energy is injected.

When the fourth phase P4 ends and the injection of the second injection signal Inj 2 is completed, the oscillation signal XTAL $f_{XO}$ has a second swing voltage V2 greater than the first swing voltage V1.

As described above, while turning on/off the plurality of switches included in the oscillator 100 through the FSM 200 in the first phase P1 to the fourth phase P4, the electronic device 1000 according to various example embodiments of the inventive concepts may sequentially inject the first injection frequency $f_{INJ1}$ and a second injection frequency $f_{INJ2}$ in different phases, thereby generating the oscillation signal XTAL $f_{XO}$ having the target swing voltage. In particular, the first injection signal Inj 1 may be generated through dithering in the first phase P1, and in the third phase P3, the second injection signal Inj 2 locked to the correct frequency through the sampling PLL may be generated and injected, so that it is possible to shorten the oscillation time.

Figure 11:
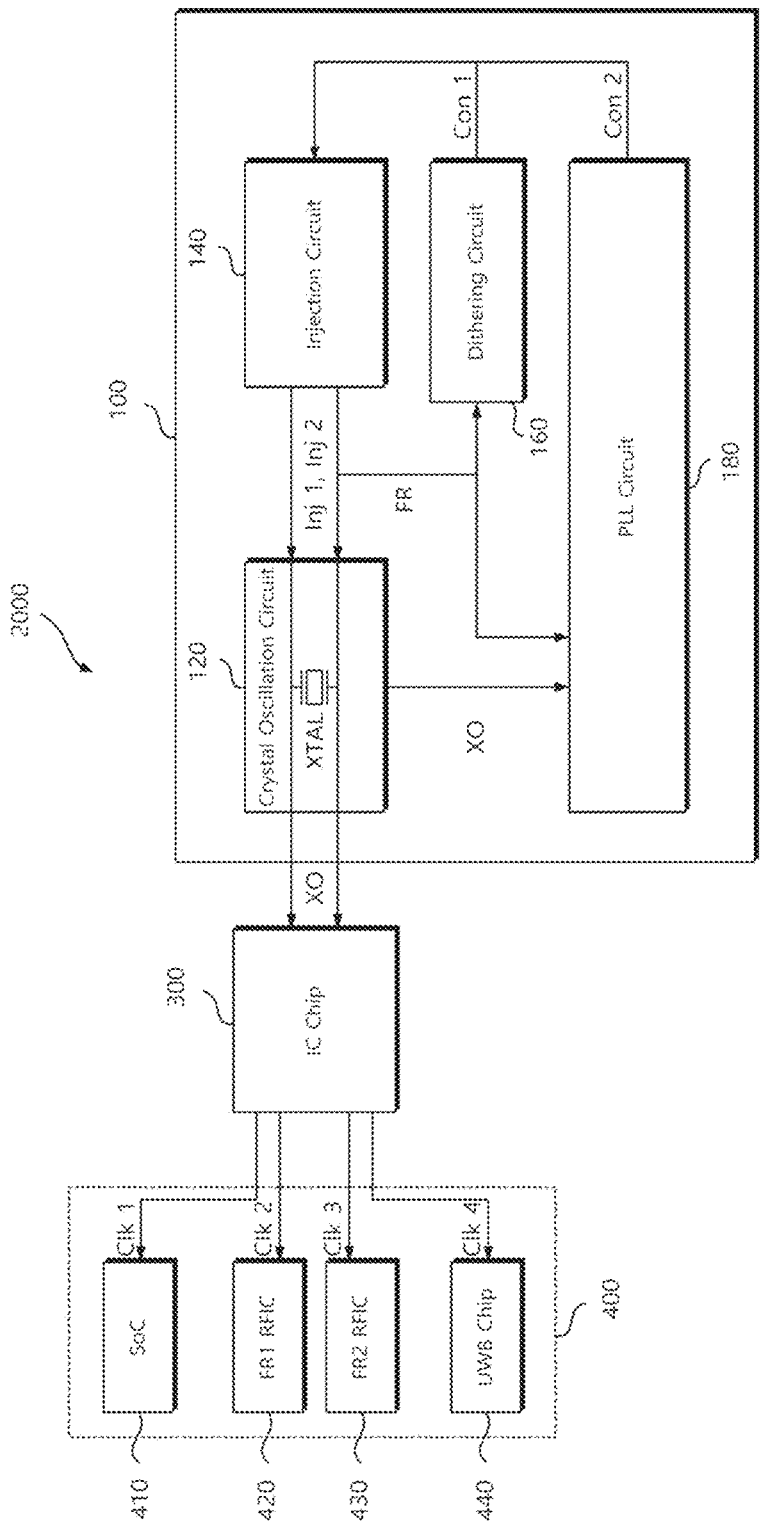
FIG. 11 is a diagram illustrating an electronic system according to an example embodiment of the inventive concepts.

FIG. 11 is a diagram illustrating an electronic system according to an example embodiment of the inventive concepts.

Referring to FIG. 11, the electronic system 2000 includes the oscillator 100, an IC chip 300, and at least one external device 400.

The oscillator 100 generates the oscillation signal XO having the natural frequency $f_{XO}$ by injecting the first injection signal Inj 1 and the second injection signal Inj 2 in the first phase P1 to the fourth phase P4.

The IC chip 300 is connected to the oscillator 100 to receive the oscillation signal XO and convert the received oscillation signal XO into at least one clock signal. For example, the IC chip 300 may be configured to convert the oscillation signal XO, which is a sine wave signal, into a square wave signal, and generate at least one clock signal to be used for each of the at least one external device 400 based on the converted square wave signal.

The at least one external device 400 may receive a clock signal to be used for each from the IC chip 300 and operate based on the clock signal. According to an example embodiment, as shown in FIG. 11, the at least one external device 400 may include a system on chip (SoC) 410, FR 1 radio frequency IC (RFIC) 420, FR 2 RFIC 430, and an ultra-wide band (UWB) 440, but example embodiments will not be limited thereto.

One or more of the elements disclosed above may include or be implemented in one or more processing circuitries such as hardware including logic circuits; a hardware/software combination such as a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FGPA), a System-on-Chip (SoC), a programmable logic unit, a microprocessor, application-specific integrated circuit (ASIC), etc.

While some inventive concepts have been described with reference to example embodiments thereof, it will be apparent to those of ordinary skill in the art that various changes and modifications may be made thereto without departing from the scope of the inventive concepts.

What is claimed is:
1. An oscillator comprising:
a crystal oscillation circuit configured to generate an oscillation signal having a natural frequency;

an injection circuit configured to inject a first injection signal and a second injection signal having a different frequency from the first injection signal into the crystal oscillation circuit;

a dithering circuit configured to transmit a first control signal for generating the first injection signal to the injection circuit; and a phased-lock loop (PLL) circuit configured to lock a phase of the first injection signal to the natural frequency, to transmit a second control signal for generating the second injection signal to the injection circuit.

2. The oscillator of claim 1, wherein the oscillation signal has a first swing voltage when the first injection signal is injected, and the oscillation signal has a second swing voltage that is greater than the first swing voltage when the second injection signal is injected.

3. The oscillator of claim 1, wherein the injection circuit is configured to inject the first injection signal based on the first control signal, and the injection circuit is configured to inject the second injection signal based on the second control signal, after injecting the first injection signal.

4. The oscillator of claim 1, wherein the injection circuit includes:

a voltage controlled oscillator configured to generate the first injection signal based on the first control signal, to generate the second injection signal based on the second control signal; and a switching unit connected to the crystal oscillation circuit to inject the first injection signal and the second injection signal into the crystal oscillation circuit according to a switching operation.

5. The oscillator of claim 4, wherein the dithering circuit includes:

a divider configured to divide a free-running frequency of the voltage controlled oscillator to generate a dithering signal having a specific frequency width;

an alternating current (AC)-coupling circuit configured to AC-couple the dithering signal;

a first switch connected to the AC-coupling circuit to pass the dithering signal according to a switching operation;

a direct current (DC)-coupling circuit connected to the first switch to DC-couple a temperature proportional voltage proportional to an absolute temperature of the voltage controlled oscillator, and bias the dithering signal to the temperature proportional voltage; and a second switch connected to the AC-coupling circuit and the DC-coupling circuit to pass the dithering signal biased to the temperature proportional voltage according to a switching operation.

6. The oscillator of claim 5, wherein the dithering circuit further includes:

a gain adjustment unit connected to the voltage controlled oscillator and the PLL circuit to control a loop gain of the PLL circuit based on the first injection signal.

7. The oscillator of claim 4, wherein the voltage controlled oscillator includes a ring voltage controlled oscillator including a plurality of delay cells.

8. The oscillator of claim 1, wherein the PLL circuit is configured to sample the oscillation signal to obtain a sampling voltage, compare the sampling voltage with a reference voltage, and adjust the second control signal until the sampling voltage reaches the reference voltage.

9. The oscillator of claim 8, wherein the PLL circuit includes:

a first switch connected to the injection circuit to pass the first injection signal according to a switching operation;

a sampling circuit connected to the first switch and the crystal oscillation circuit, the sampling circuit configured to sample the oscillation signal based on the first injection signal to obtain the sampling voltage;

a reference voltage providing circuit configured to provide the reference voltage;

a transconductance cell configured to compare the sampling voltage with the reference voltage to generate the second control signal according to a comparison result; and a second switch configured to pass the second control signal according to a switching operation.

10. The oscillator of claim 9, wherein the sampling circuit includes:

a sample and hold circuit including a third switch configured to perform a switching operation according to the first injection signal and a capacitor; and a dummy circuit connected to the sample and hold circuit to have a differential structure.

11. The oscillator of claim 9, wherein the phase of the first injection signal is locked to the natural frequency when the sampling voltage reaches the reference voltage.

12. An electronic device comprising:

an oscillator configured to generate an oscillation signal having a natural frequency by injecting a first injection signal and a second injection signal through a first phase, a second phase, a third phase and a fourth phase; and a finite state machine (FSM) configured to control the oscillator in the first to fourth phases, wherein the oscillator includes a crystal oscillation circuit configured to generate the oscillation signal, an injection circuit configured to inject the first injection signal and the second injection signal into the crystal oscillation circuit in each of the first and fourth phases, a dithering circuit configured to transmit a first control signal for generating the first injection signal to the injection circuit in the first phase and the second phase, and a phased-lock loop (PLL) circuit configured to lock a phase of the first injection signal to the natural frequency in the third phase, to transmit a second control signal for generating the second injection signal to the injection circuit.

13. The electronic device of claim 12, wherein the oscillation signal has a first swing voltage in the second and third phases, and the oscillation signal has a second swing voltage that is greater than the first swing voltage after the fourth phase.

14. The electronic device of claim 12, wherein the injection circuit includes:

a voltage controlled oscillator configured to generate the first injection signal based on the first control signal, and to generate the second injection signal based on the second control signal; and a switching unit connected to the crystal oscillation circuit, the switching unit configured to inject the first injection signal and the second injection signal into the crystal oscillation circuit in the first and fourth phases according to the FSM.

15. The electronic device of claim 14, wherein the dithering circuit includes:

a divider configured to divide a free-running frequency of the voltage controlled oscillator to generate a dithering signal;

an alternating current (AC)-coupling circuit configured to AC-couple the dithering signal;

a first switch connected to the AC-coupling circuit and configured to pass the dithering signal in the first phase according to the FSM;

a direct current (DC)-coupling circuit connected to the first switch to DC-couple a temperature proportional voltage proportional to an absolute temperature of the voltage controlled oscillator, and bias the dithering signal to the temperature proportional voltage; and a second switch connected to the AC-coupling circuit and the DC-coupling circuit and configured to pass the dithering signal biased to the temperature proportional voltage in the first and second phases according to the FSM.

16. The electronic device of claim 15, wherein a voltage of the first control signal is equal to the temperature proportional voltage in the second phase.

17. The electronic device of claim 12, wherein the PLL circuit includes:

a first switch connected to the injection circuit and configured to pass the first injection signal in the third phase according to the FSM;

a sampling circuit connected to the first switch and the crystal oscillation circuit, and configured to sample the oscillation signal based on the first injection signal to obtain a sampling voltage;

a reference voltage providing circuit configured to provide a reference voltage;

a transconductance cell configured to compare the sampling voltage with the reference voltage to generate the second control signal according to a comparison result; and a second switch configured to be controlled to pass the second control signal in the third phase according to the FSM.

18. The electronic device of claim 17, wherein the phase of the first injection signal is locked to the natural frequency when the sampling voltage reaches the reference voltage in the third phase.

19. An electronic system comprising:

an oscillator configured to generate an oscillation signal having a natural frequency by injecting a first injection signal and a second injection signal through a first phase, a second phase, a third phase and a fourth phase;

an integrated circuit (IC) chip configured to convert the oscillation signal into at least one clock signal; and at least one external device configured to receive one of the at least one clock signal, wherein the oscillator includes a crystal oscillation circuit configured to generate the oscillation signal, an injection circuit configured to inject the first injection signal and the second injection signal into the crystal oscillation circuit in each of the first and fourth phases, a dithering circuit configured to transmit a first control signal for generating the first injection signal to the injection circuit in the first phase and the second phase, and a phased-lock loop (PLL) circuit configured to lock a phase of the first injection signal to the natural frequency in the third phase, to transmit a second control signal for generating the second injection signal to the injection circuit.

20. The electronic system of claim 19, wherein the oscillation signal has a first swing voltage in the second and third phases, and the oscillation signal has a second swing voltage that is greater than the first swing voltage after the fourth phase.

* * * * *